United States Patent
Kim et al.

(10) Patent No.: US 10,306,815 B1
(45) Date of Patent: May 28, 2019

(54) ELECTROMAGNETIC INTERFERENCE GASKET

(71) Applicant: JOINSET CO., LTD., Gyeonggi-do (KR)

(72) Inventors: Sun-Ki Kim, Gyeonggi-do (KR); Sung-Ho Cho, Gyeonggi-do (KR); Byung-Sun Jung, Gyeonggi-do (KR); Eung-Won Kim, Gyeonggi-do (KR)

(73) Assignee: Joinset Co., Ltd. (KR)

( * ) Notice: Subject to any disclaimer, the term of this patent is extended or adjusted under 35 U.S.C. 154(b) by 0 days.

(21) Appl. No.: 16/180,295

(22) Filed: Nov. 5, 2018

(30) Foreign Application Priority Data

Nov. 24, 2017 (KR) .................. 10-2017-0158737
Jun. 26, 2018 (KR) .................. 10-2018-0073641

(51) Int. Cl.
*H01R 13/6584* (2011.01)
*H05K 9/00* (2006.01)

(52) U.S. Cl.
CPC ......... *H05K 9/0015* (2013.01); *H05K 9/0018* (2013.01); *H05K 9/0081* (2013.01); *H01R 13/6584* (2013.01)

(58) Field of Classification Search
CPC ............... H05K 9/0018; H05K 9/0015; H01R 13/6581; H01R 13/6585; H01R 13/6584
See application file for complete search history.

(56) References Cited

U.S. PATENT DOCUMENTS

| | | | | |
|---|---|---|---|---|
| 5,656,795 A * | 8/1997 | Miska | .............. | H05K 7/1438 |
| | | | | 174/356 |
| 6,320,122 B1 * | 11/2001 | Dickey | .............. | H05K 9/0018 |
| | | | | 174/359 |
| 6,477,061 B1 * | 11/2002 | Johnson | .............. | G06F 1/182 |
| | | | | 174/351 |
| 6,613,976 B1 * | 9/2003 | Benn, Jr. | .............. | H05K 9/0015 |
| | | | | 174/358 |
| 2003/0037943 A1 * | 2/2003 | Jensen | .............. | G06F 1/182 |
| | | | | 174/355 |
| 2004/0094904 A1 * | 5/2004 | Grant | .............. | F16J 15/027 |
| | | | | 277/628 |
| 2006/0081389 A1 * | 4/2006 | Pille | .............. | H05K 5/0243 |
| | | | | 174/381 |

* cited by examiner

*Primary Examiner* — Hung V Ngo
(74) *Attorney, Agent, or Firm* — Locke Lord LLP; Alan B. Clement; Peter J. Fallon

(57) ABSTRACT

Disclosed is an electromagnetic interference (EMI) gasket capable of reliably shielding an electronic component accommodated therein from electromagnetic waves. The EMI gasket includes an elastic core which includes a first surface and a second surface opposite to each other in a thickness direction and a through hole passing through the first and second surfaces and an electroconductive cover which adheres to the first surface with an adhesive interposed therebetween. Here, parts of the cover which face the through hole are incised to integrally form a plurality of blocking parts, and the blocking parts cover and adhere to sidewalls of the through hole.

14 Claims, 8 Drawing Sheets

ELECTROMAGNETIC INTERFERENCE GASKET

CROSS-REFERENCE TO RELATED APPLICATION

This application claims priority to and the benefit of Korean Patent Application No. 2017-0158737, filed on Nov. 24, 2017 and 2018-0073641, filed on Jun. 26, 2018, the disclosure of which is incorporated herein by reference in its entirety.

BACKGROUND

1. Field of the Invention

The present invention relates to an electroconductive electromagnetic interference (EMI) gasket, and more particularly, to a technology capable of protecting internally accommodated electronic components by reliably shielding externally generated electromagnetic waves or capable of reliably shielding electromagnetic waves generated by internally accommodated electronic components not to leak outward.

2. Discussion of Related Art

As electronic communication devices including cellular phones have been advanced and highly functional, a processing speed of a microprocessor increases such that electromagnetic waves and heating rear up as big problems.

Accordingly, a heat-dissipation unit is generally used to quickly dissipate heat generated by a microprocessor to the outside.

A heat-dissipation unit is, for example, interposed between a device and an electronic component which is mounted on a circuit board and heats, is configured as thermal interface materials mounted on a heating element such as the electronic component mounted on the circuit board such that heat generated by the electronic component is transferred to a shield case or the device through the thermal interface materials to be cooled and dissipated.

At the same time, in order to shield electromagnetic waves generated by the electronic component mounted on the circuit board or to protect the electronic component mounted on the circuit board from externally generated electromagnetic waves, an electromagnetic interference (EMI) gasket having electrical conductivity and elasticity may be applied between the device and the circuit board on which the electronic component is mounted.

FIG. 1 illustrates a general EMI gasket.

As well known, an EMI gasket 10 includes an elastic core 11, an electroconductive metal foil, which surrounds the core 11 with an adhesive 12 interposed therebetween, and an electroconductive cover 13 formed of an electroconductive film or electroconductive fibers. Here, a part exposed outward from the electroconductive cover 13 is electrically conductive and is used while being adhesively interposed between electroconductive objects located above and below the gasket 10 with adhesive means such as a double-sided adhesive tape and the like which is attached to at least one of a top surface and a bottom surface of the electroconductive cover 13.

Here, generally, an electrically insulating polymer sponge material is used as the elastic core 11 for a reduced cost and improved elastic restorability.

As a material of the elastic core 11, thermoplastic urethane sponge, polyethylene sponge, polyolefine sponge, thermosetting sponge, and the like are present.

Referring to FIG. 1, since the gasket 10 includes an accommodation portion 16 which passes through top and bottom surfaces thereof such that an electronic component is accommodated in the accommodation portion 16, the gasket 10 shields electromagnetic waves, which flow in from the outside, and prevents electromagnetic waves generated by the electronic component from leaking outward.

The gasket 10 is manufactured by continuously covering a general roll type elastic core 11 with a roll type electroconductive cover 13 to allow the cover 13 to adhere thereto, forming the accommodation portion 16 by blanking with a blade, and cutting the rolls into a necessary length.

Since the gasket 10 manufactured as described above is cut into a certain length to be used, both cross sections of the elastic core 11, which has electrical insulating properties in a longitudinal direction (Y direction), are exposed outward. Also, since the electrical insulating elastic core 11 is externally exposed at a section 16a formed when the accommodation portion 16 is formed, as a result, both cross sections of the gasket 10 in a longitudinal direction are not surrounded by the electroconductive cover 13 such that electromagnetic waves flow into an electronic component accommodated in the accommodation portion 16 from the outside along a longitudinal direction and electromagnetic waves generated by the electronic component leak outward.

For example, when a through hole is formed at a certain part of the EMI gasket as necessary and an electronic component generating electromagnetic waves is located in the through hole or at a part connected to the through hole, electromagnetic waves generated by the electronic component leak outward or flow therein in a part not surround by the electroconductive cover.

Also, in some cases, when both cross sections of the gasket 10 in a lateral direction (X direction) are not surrounded by the electroconductive cover, the section 16a of the accommodation portion 16 is exposed such that electromagnetic waves leak outward or flow therein in the lateral direction.

Automation is difficult and operation is complicated to completely cover a core, which is externally exposed at a section having a variety of shapes, with an electroconductive cover in order to overcome the above limitations.

SUMMARY OF THE INVENTION

The present invention is directed to providing an electromagnetic interference (EMI) gasket capable of reliably shielding electromagnetic waves, which flow into an electronic component through a through hole, and preventing electromagnetic waves generated by the electronic component from leaking outward, by using a simple structure.

The present invention is also directed to providing an EMI gasket capable of reliably shielding an inflow or outflow of electromagnetic waves through a part not surrounded by an electroconductive cover.

The present invention is also directed to providing an EMI gasket which is easily located between objects, easily shields electromagnetic waves, and easily transfers heat.

The present invention is also directed to providing an EMI gasket capable of being manufactured in a continuous manufacturing process and being easily manufactured to have economic feasibility.

According to one aspect of the present invention, an EMI gasket for shielding electromagnetic waves or grounding electricity includes an elastic core which includes a first surface and a second surface opposite to each other in a thickness direction and a through hole passing through the first and second surfaces and an electroconductive cover which adheres to the first surface with an adhesive interposed therebetween. Here, parts of the cover which face the through hole are incised to integrally form a plurality of blocking parts, and the blocking parts cover and adhere to sidewalls of the through hole.

A polymer film may adhere to any one of the first and second surfaces of the core due to an additional adhesive therebetween or self-adhesion of the core, and the polymer film may include an opening formed corresponding to the through hole.

An electroconductive adhesive member may adhere to the second surface of the core except the through hole.

The adhesive may be one of an adhesive tape having self adhesion, a hot melt having adhesion through heat, and an adhesive which is a liquid and becomes a solid through curing.

The blocking parts may be bent and extend above the second surface and adhere to the second surface, and both lateral ends of the cover may not cover a side surface of the core.

The both lateral ends of the cover may cover side surfaces of the core, may be bent and extend above the second surface, and may adhere to the second surface.

According to another aspect of the present invention, an EMI gasket for shielding electromagnetic waves or grounding electricity includes an elastic core which includes a first surface and a second surface opposite to each other in a thickness direction and a through hole passing through the first and second surfaces and an electroconductive cover which adheres to the first surface with an adhesive interposed therebetween. Here, parts of the cover which face the through hole are incised to integrally form at least a pair of blocking parts which face each other in a longitudinal direction. Also, both lateral ends of the cover side surfaces of the core, are bent and extend above the second surface and adhere to the second surface. The blocking parts cover and adhere to sidewalls of the through hole in the longitudinal direction.

A polymer film may adhere to any one of the first and second surfaces of the core due to an additional adhesive therebetween or self-adhesion of the core, and the polymer film may include an opening formed corresponding to the through hole.

According to another aspect of the present invention, an EMI gasket for shielding electromagnetic waves or grounding electricity includes an elastic core which includes a first surface and a second surface opposite to each other in a thickness direction and a through hole passing through the first and second surfaces, an electroconductive first cover which adheres to the first surface with an adhesive interposed therebetween, and an electroconductive second cover which includes an opening facing the through hole and adheres to the second surface with an adhesive interposed therebetween. Here, parts of the first cover at a position facing the through hole are incised to integrally form a pair of blocking parts which face each other in a longitudinal direction of the core. Parts of the second cover at a position facing the through hole are incised to integrally form a pair of blocking parts which face each other in a lateral direction of the core. The blocking parts of the first and second covers cover and adhere to sidewalls of the through hole in the longitudinal direction and the lateral direction.

According to another aspect of the present invention, an EMI gasket for shielding electromagnetic waves or grounding electricity includes an elastic core which includes a first surface and a second surface opposite to each other in a thickness direction and a through hole passing through the first and second surfaces, a thermally conductive support which adheres to the second surface, and an electroconductive cover which adheres to the first surface. Here, parts of the cover which face the through hole are incised to integrally form blocking parts, and the blocking parts cover sidewalls of the through hole.

The blocking parts of the cover may adhere to the sidewalls of the through hole of the core. On the other hand, the blocking parts of the cover may not adhere to the sidewalls of the through hole of the core but may adhere to the thermally conductive support.

According to another aspect of the present invention, an EMI gasket for shielding electromagnetic waves or grounding electricity includes an elastic core which includes a first surface and a second surface opposite to each other in a thickness direction and a through hole passing through the first and second surfaces, an electroconductive first cover which adheres to the first surface, and an electroconductive second cover which adheres to the second surface. Here, the first and second covers include blocking parts formed at a position corresponding to the through hole, and the blocking parts of the first and second covers adhere to each other in the through hole and cover sidewalls of the through hole of the core.

The first and second covers may be electroconductive adhesive tapes, and at least any one thereof may be an electroconductive double-sided adhesive tape.

The blocking parts of the first and second covers may not adhere to the sidewalls of the through hole of the core.

A size of an opening formed by the first and second covers in the through hole may be smaller than a size of the through hole.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

The technical terms used herein are merely for explaining particular embodiments and are not intended to limit the present invention. Also, the technical terms used herein, unless defined otherwise, should be interpreted as having meanings commonly understood by one of ordinary skill in the art and not be interpreted as having excessively comprehensive meanings or excessively reduced meanings. Also, when the technical terms used herein are wrong technical terms which can not clearly represent the concept of the present invention, they should be understood as being replaced by technical terms capable of being properly understood by those skilled in the art. Also, general terms used herein should be interpreted according to the defined in a dictionary or according to back-and-forth context and not be understood as having excessively reduced meanings.

Hereinafter, the present invention will be described in detail with reference to the attached drawings.

First Embodiment

Figure 2A:
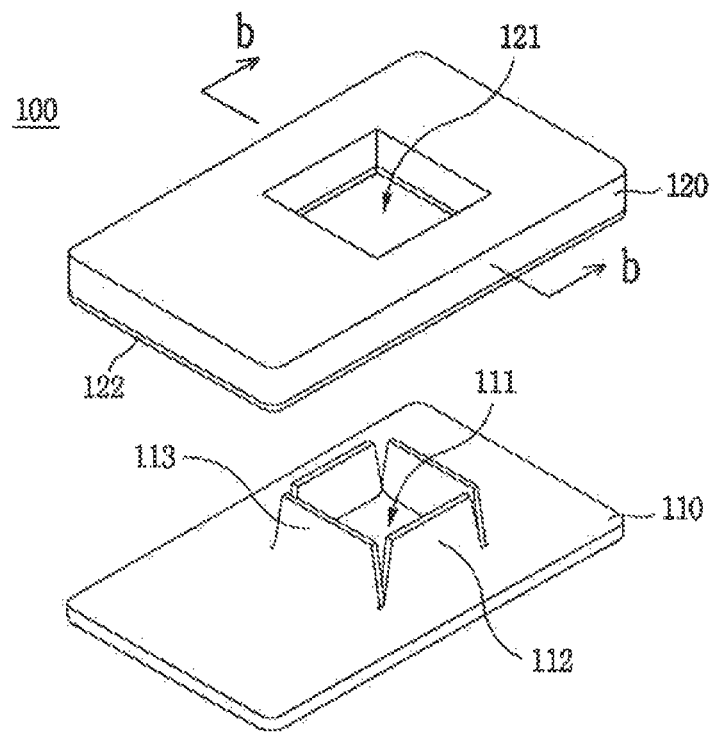
FIG. 2A is an exploded perspective view of an EMI gasket according to a first embodiment of the present invention.
Figure 2B:
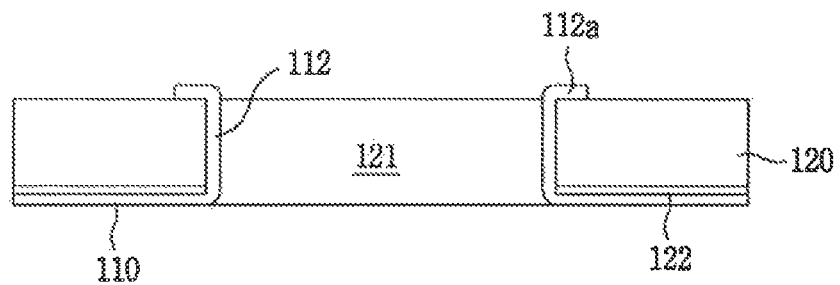
FIG. 2B is a cross-sectional view taken along a line b-b of FIG. 2A.

FIG. 2A is an exploded perspective view of an electromagnetic interference (EMI) gasket according to a first embodiment, and FIG. 2B is a cross-sectional view taken along a line b-b of FIG. 2A.

An EMI gasket 100 includes a core 120, in which one or more through holes 121 are formed, and an electroconductive cover 110 adhering to at least one surface, for example, a bottom surface of the core 120 with an adhesive 122 intervening therebetween. The EMI gasket 100 is cut into a necessary length or shape so as to shield electromagnetic waves or to be electrically grounded.

In the embodiment, all side surfaces of the core 120 are externally exposed such that the EMI gasket 100 is not limited by the cover 110 and has similar elasticity and restorability to those of the core 120.

When the EMI gasket 100 adheres to a facing object, for example, the EMI gasket 100 may easily adhere to the object by attaching an electroconductive adhesive member, for example, an electroconductive double-sided adhesive tape to a bottom surface of the cover 110 or a top surface of the core 120. Here, when the adhesive member adheres to the bottom surface of the cover 110, an electrical insulating adhesive member may be used when a width of the adhesive member is narrower than a width of the EMI gasket 100.

The adhesive member may be, for example, an adhesive tape having self-adhesion, a hot melt having an adhesive force due to heat, or an adhesive which is a liquid and becomes a solid through curing and may include electrical conductivity as necessary but may be electrically insulated.

Figure 1:
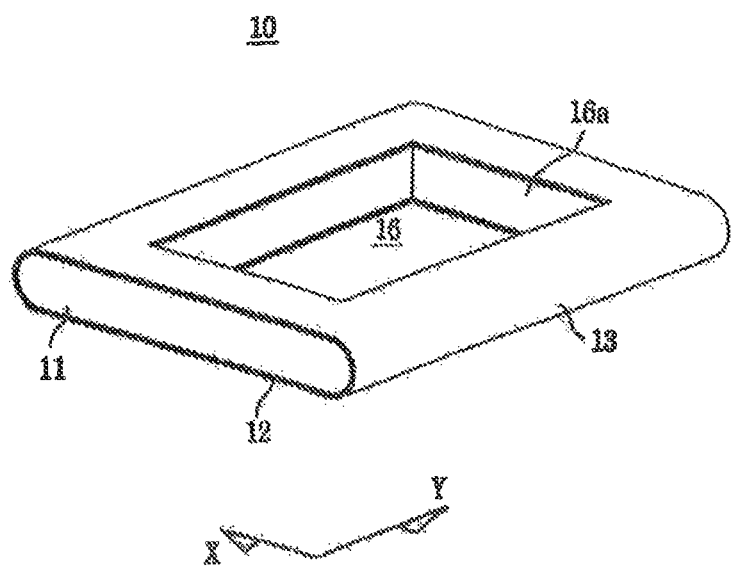
FIG. 1 illustrates a general electromagnetic interference (EMI) gasket.

In the present invention, a longitudinal direction of the EMI gasket refers to a direction in which the EMI gasket is continuously supplied as a roll (Y direction of FIG. 1), and a lateral direction thereof refers to a direction intersecting the longitudinal direction (X direction of FIG. 1).

Although a size of the EMI gasket 100 is not particularly limited, a width and a length may be three times a thickness. In consideration of a wavelength and amplitude of an electromagnetic wave or a position or a size of the through hole formed in the EMI gasket 100, as the width and the length of the EMI gasket 100 are much greater than the thickness, an effect of shielding horizontal inflow and outflow of electromagnetic waves is high and manufacturing is easily performed.

The core 120 is an electrical insulating body which has high elasticity and restorability and has much greater electrical resistance than that of the cover 110, may be thermoplastic urethane sponge, polyethylene sponge, polyolefin, or thermoplastic silicone sponge which is melted by heat, and may be, for example, one type of Poron which is a brand name of U.S. Rogers Corp.

When a small thickness and heat resistance are necessary, a nonfoam silicone rubber having low hardness may be applied as the core 120.

The core 120 has a uniform thickness to be flat but is not limited thereto and includes the through hole 121 formed passing through the top surface and the bottom surface thereof.

To allow blocking parts 112 and 113 of the cover 110 to easily cover a large part of sidewalls of the through hole 121, a plurality of such through hole 121, which have a quadrangular shape, include vertical sidewalls, have the same size or a variety of sizes, may be formed.

As described below, for example, the EMI gasket 100 may intervene between a shield can and a metal case. In this case, the through hole 121 may accommodate thermal interface materials which connect a heating source to the metal case.

Optionally, a polymer film such as polyethylene terephthalate (PET), Polyimide (PI), and the like adheres to any one of the top surface and the bottom surface of the core 120 so as to provide mechanical strength to the EMI gasket 100. Also, aluminum foil, paper, or the like may be used instead of the polymer film.

Adhesion between the core 120 and the polymer film may use an additional adhesive or self adhesion of the core 120. For example, the core 120 and the polymer film may adhere to each other by casting and curing a liquid polyurethane resin on the polymer film.

The polymer film prevents the core 120 from stretching due to mechanical strength thereof while the EMI gasket 100 is manufactured such that manufacturing is easily performed and the cover 110 easily adheres to the sidewalls of the through hole 121.

The cover 110 may be flexible electroconductive fibers including a metal layer, an electroconductive film having at least one surface, on which a metal layer is formed, or metal foil and may be soldering. The electrical resistance of the cover 110 is less than 1 ohm, and smaller electrical resistance is better.

An electroconductive adhesive tape coated with an adhesive may be applied to the cover 110 and may have single-sided adhesion or double-sided adhesion. The cover 110 adheres to the core 120 due to the adhesive 122. When the electroconductive adhesive tape coated with an adhesive is applied to the cover 110, an additional adhesive is not necessary.

Here, the adhesive 122 may be an acrylic resin-based material, a urethane resin-based material, or silicone rubber-based material.

The blocking parts 112 and 113 of the cover 110 may cover the sidewalls of the through hole 121 but may not adhere to the sidewalls, which will be described below.

The blocking parts 112 and 113, which form a pair and face each other, have same or similar size and shape and may have a shape capable of covering the sidewalls of the through hole 121 as much as possible to have a high electromagnetic wave shielding effect.

In the embodiment, since the through hole 121 has a quadrangular shape and is vertically formed, each of the blocking parts 112 and 113 forms a boundary at a corner and may overlap with a boundary part.

In the embodiment, since the thickness of the core 120 is small, the blocking parts 112 and 113 have an approximate quadrangular shape but may have an approximate triangular shape according to an incision shape of the cover 110.

The blocking parts 112 and 113 may be formed, for example, by incising a cover part of a position corresponding to the through hole 121 of the core 120 and bending upward the incised part. Here, an opening 111 corresponding to the through hole 121 may be formed in the cover 110.

The blocking parts 112 and 113, as described below, perform a function of blocking electromagnetic waves, which horizontally flow in or discharge through the through hole 121, by covering the sidewalls of the through hole 121 formed in the core 120.

The blocking parts 112 and 113 are formed to have a quadrangular or triangular shape equal or similar to a shape of the sidewalls of the through hole 121 so as to cover the sidewalls of the through hole 121 as much as possible. Particularly, the blocking parts 112 and 113 have a width and a height equal to or greater than a lateral length and a longitudinal length of the sidewalls of the through hole 121 so as to cover the sidewalls of the through hole 121 as much as possible.

In the embodiment, the blocking parts 112 and 113 are formed to be greater than the thickness of the core 120 and ends 112a are bent to extend toward the top surface of the core 120.

According to a structure, the ends 112a of the blocking parts 112 and 113 come into electrical contact with an electroconductive object opposite thereto and the blocking parts 112 and 113 more reliably adhere to the sidewalls of the through hole 121.

Particularly, an electromagnetic wave shielding effect may be increased by minimizing parts of the sidewalls of the through hole 121 which are not covered by the blocking parts 112 and 113.

As a result thereof, electromagnetic waves, which horizontally flow in or discharge through the gasket 100, may be much more shielded by the blocking parts 112 and 113 of the cover 110.

Unlike the embodiment, the height of the blocking parts 112 and 113 may be equal or similar to the thickness of the core 120 such that the blocking parts 112 and 113 cover only the sidewalls of the through hole 121. In this case, as described below, it is necessary to extend other parts of the cover 110 toward the top surface of the core 120.

Figure 3A:
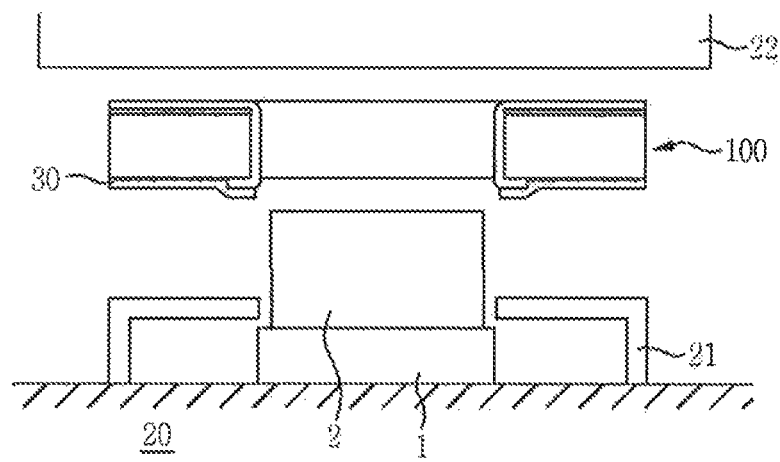
FIGS. 3A and 3B illustrate a state in which the EMI gasket is applied.
Figure 3B:
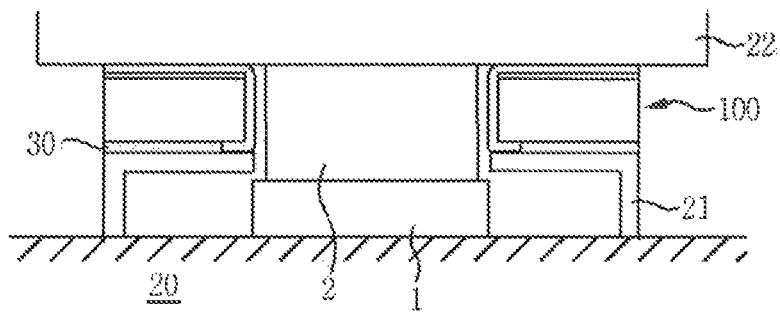

FIGS. 3A and 3B illustrate a state in which the EMI gasket is applied.

The EMI gasket 100 may be reel-taped and may be fixed to the electroconductive object by reflow soldering through vacuum pickup or an electroconductive adhesive tape.

An electronic component 1 mounted on a circuit board 20 is covered by a metal shield can 21, which has an opening at a top surface, the EMI gasket 100 adheres to the shield can 21, and for example, a metal case 22 comes into pressurized contact with the EMI gasket 100 such that the electronic component 1 and the case 22 are thermally connected to each other by thermal interface materials 2 and electromagnetic waves are shielded by the EMI gasket 100.

Here, the EMI gasket 100 may adhere to the shield can 21, for example, by interposing an electroconductive double-sided adhesive tape 30 adhering to the top surface of the core 120.

According to a structure as described above, electromagnetic waves, which horizontally and vertically flow in or discharge, are shielded by the metal case 22, and electromagnetic waves, which flow in or discharge in a horizontal direction (X direction and Y direction), are shielded by the EMI gasket 100 installed in a gap between the case 22 and the shield can 21.

In detail, since the side surface of the core 120 of the EMI gasket 100 is externally exposed, electromagnetic waves flow in from the outside through the side surface. Here, the electroconductive cover 110 covers the sidewalls of the through hole 121 formed in the core 120 such that electromagnetic waves, which flow in from the outside through the side surface, are blocked.

Likewise, since electromagnetic waves generated by the electronic component 1 are also blocked by the electroconductive cover 110 at the sidewalls of the through hole 121, the electromagnetic waves are not externally discharged.

Accordingly, since electromagnetic waves are blocked at the through hole 121 even when all the side surfaces of the core 120 are exposed, electromagnetic waves, which horizontally flow in or discharge, may be simply and efficiently blocked.

Particularly, since electromagnetic waves generated by the electronic component located in a space connected through the through hole 121 are shielded at a closest distance, efficiency of shielding electromagnetic waves is high.

Also, since the core 120, which is a roll including the through hole 121, and the cover 110, which is a roll including the blocking parts 112 and 113, continuously adhere and the blocking parts 112 and 113 are bent and adhere to the sidewalls of the through hole 121, workability is high such that mass production may be possible, manufacturing costs may be reduced, and precise-sized products may be manufactured.

The EMI gasket 100 according to the embodiment may be, for example, manufactured using a following method but is not limited thereto.

The core 120 including the through hole 121 and the cover 110 including the blocking parts 112 and 113 incised corresponding to the through hole 121 and coated with the adhesive 122 are continuously supplied and pass through a mold together such that the cover 110 and the core 120 are output while adhering to each other.

In this state, when a jig moves upward from a bottom of an incised part of the cover 110, the incised blocking parts 112 and 113 are bent by the jig and adhere to the sidewalls of the through hole 121 of the core 120.

Afterwards, the ends 112a of the blocking parts 112 and 113 are bent by another jig at the top surface of the core 120 to adhere to the top surface of the core 120.

As described above, the core 120 and the cover 110 which are formed as rolls continuously adhere and are processed. The EMI gasket 100 is manufactured by cutting a continuous EMI gasket roll into pieces having a preset length by a blade-shaped mold.

According to the above-described manufacturing method, since the electroconductive cover 110 does not cover all sections of the EMI gasket 100, which have a variety of complicated shapes, and the blocking parts 112 and 113 cover the sidewalls of the through hole 121, it is possible to easily and economically manufacture the EMI gasket 100.

In the EMI gasket 100 according to the embodiment, since the sidewalls of the through hole 121 may be much more covered particularly when the height of the EMI gasket 100 is lower than the width and length thereof, electromagnetic waves may be efficiently shielded. Due to the simple structure, manufacturing costs thereof are low and manufacturing is easily performed.

Figure 4:
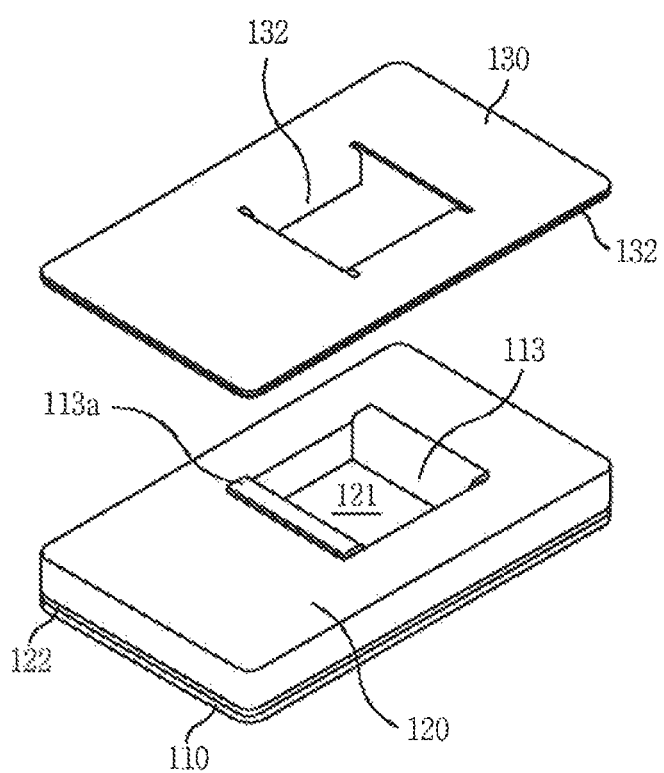
FIG. 4 illustrates a modified example of the EMI gasket of FIGS. 2A and 2B.

FIG. 4 illustrates a modified example of the EMI gasket of FIGS. 2A and 2B.

Like the embodiment of FIGS. 2A and 2B, the adhesive 122 is applied to the bottom surface of the core 120 so as to adhere the electroconductive cover 110.

The cover 110 includes the blocking parts 113 which face each other in a longitudinal direction of the core 120 at a position corresponding to the through hole 121 of the core 120. As described above, ends 113a of the blocking parts 113 are bent and extend toward the top surface of the core 120.

Another electroconductive cover 130 adheres to the top surface of the core 120 by interposing an adhesive therebetween. The cover 130 includes blocking parts 132, which face each other in a lateral direction of the core 120 at the position corresponding to the through hole 121 of the core 120.

In the embodiment of FIGS. 2A and 2B, since one cover 110 includes four blocking parts 112 and 113, gaps not covered by the cover 110 are formed at boundaries of the blocking parts 112 and 113, that is, corners of the sidewalls of the through hole 121 such that reliability in shielding electromagnetic waves may be decreased. Particularly, when the core 120 has a great thickness, areas of the sidewalls of the through hole 121 which are not covered by the cover 110 may be large.

Accordingly, in the embodiment, the blocking parts 113 blocking electromagnetic waves, which horizontally flow in or discharge along a longitudinal direction, are formed in the cover 110, and the blocking parts 132 blocking electromagnetic waves, which horizontally flow in or discharge in a lateral direction, are formed in the cover 130. Here, the blocking parts 113 and 132 have shapes and sizes equal to those of the sidewalls of the through hole 121 so as to minimize gaps formed between the blocking parts 113 and 132.

As a result thereof, an inflow and an outflow of electromagnetic waves in the lateral direction of the core 120 are blocked by the blocking parts 132 of the cover 130 which adhere to the top surface of the core 120 and an inflow and an outflow of electromagnetic waves in the longitudinal direction of the core 120 are blocked by the blocking parts 113 of the cover 110 which adhere to the bottom surface of the core 120 such that it is possible to efficiently and reliably block electromagnetic waves.

In the modified example, it is possible to more completely block electromagnetic waves by forming a pair of blocking parts, which face each other, at each of the covers 110 and 130 and overlapping the pair of blocking parts with one another like the first embodiment.

Second Embodiment

Figure 5A:
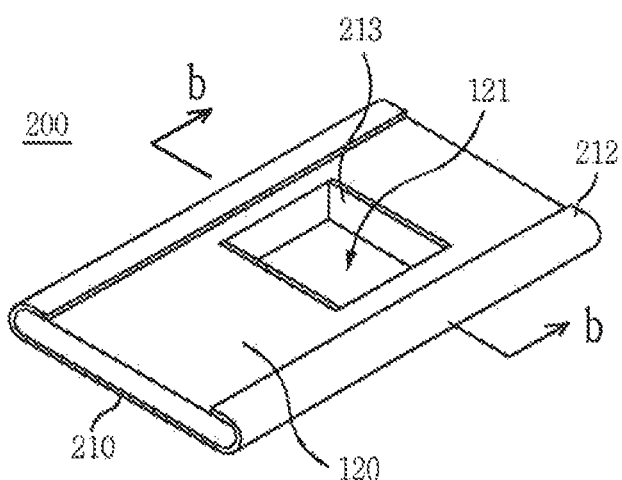
FIG. 5A is a perspective view of an EMI gasket according to a second embodiment of the present invention.
Figure 5B:
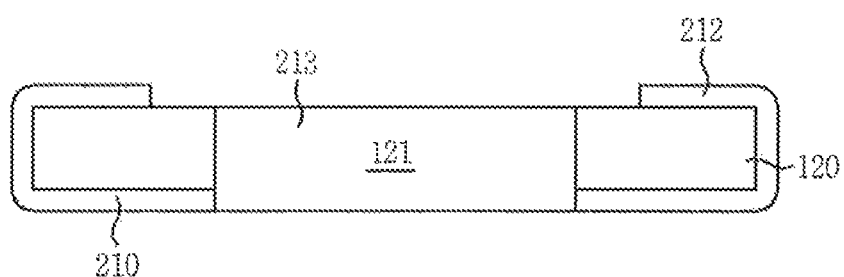
FIG. 5B is a cross-sectional view taken along a line b-b of FIG. 5A.

FIG. 5A is a perspective view of an EMI gasket according to a second embodiment of the present invention, and FIG. 5B is a cross-sectional view taken along a line b-b of FIG. 5A.

An EMI gasket 200 includes the core 120 and an electroconductive cover 210 which partially surrounds and adheres to the core 120 by interposing an adhesive therebetween.

Like the above-described first embodiment, the electroconductive cover 210 may surround the core 120 by applying the adhesive to the bottom surface of the core 120.

The cover 210 covers the bottom surface, both lateral side surfaces, a part of the top surface of the core 120 and includes extending parts 212 having a certain width and adhering to both edges of the top surface of the core 120.

In the embodiment, since the cover 210 is intended to surround both the lateral sides surfaces of the core 120, a size of the width of the extending parts 212 is not particularly limited and it is merely intended not to cover the through hole 121 of the core 120.

Meanwhile, blocking parts 213, which face each other in a longitudinal direction, are integrally formed in the cover 210 at a position corresponding to the through hole 121 and cover and adhere to the sidewalls of the through hole 121.

As a result, the extending parts 212 of the cover 210 cover the both side surfaces of the core 120 and block electromagnetic waves, which flow in or discharge in the longitudinal direction of the core 120, and the blocking parts 213 of the cover 210 cover the sidewalls of the through hole 121 and block electromagnetic waves which flow in or discharge in the longitudinal direction of the core 120.

Figure 6A:
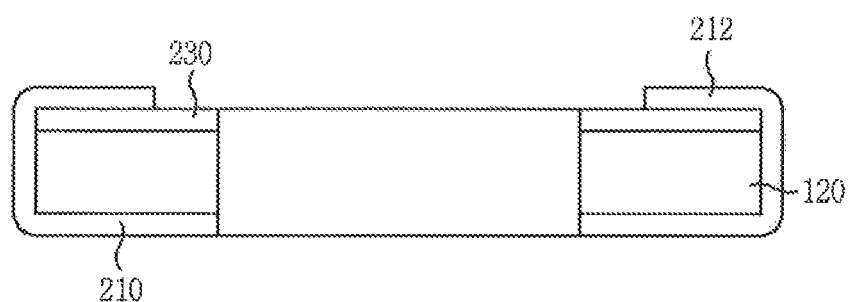
FIGS. 6A and 6B illustrate modified examples of the EMI gasket of FIGS. 5A and 5B.
Figure 6B:
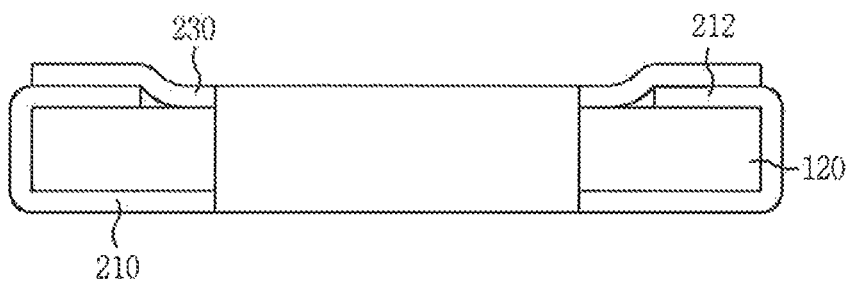

FIGS. 6A and 6B illustrate modified examples of the EMI gasket of FIGS. 5A and 5B.

An electroconductive double-sided adhesive tape 230 including a through hole formed corresponding to the through hole 121 may adhere to the top surface of the core 120.

Referring to FIG. 6A, before the cover 210 surrounds the core 120, the electroconductive double-sided adhesive tape 230 adheres to the top surface of the core 120 and then the core 120 and the electroconductive double-sided adhesive tape 230 are surrounded by the cover 210 such that the extending parts 212 of the cover 210 may adhere to the adhesive tape 230.

Unlike this, referring to FIG. 6B, the core 120 is surrounded by the cover 210 and then the electroconductive double-sided adhesive tape 230 adheres to the top surface of the core 120 such that the electroconductive double-sided adhesive tape 230 may adhere while covering the extending parts 212 of the cover 210.

Third Embodiment

Figure 7A:
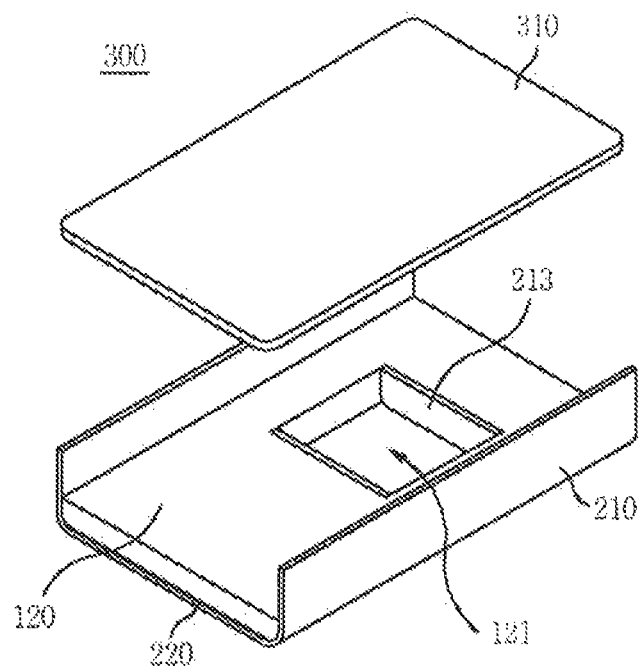
FIG. 7A is an exploded perspective view of an EMI gasket according to a third embodiment of the present invention.
Figure 7B:
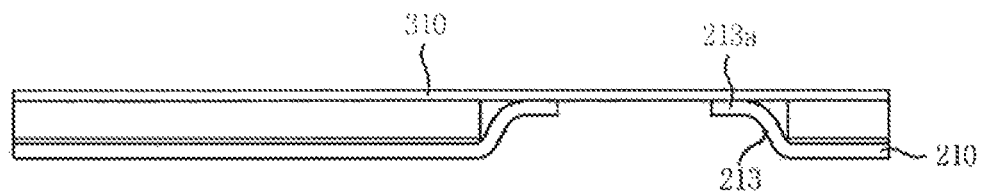
FIGS. 7B and 7C are cross-sectional views illustrating modified examples thereof.
Figure 7C:
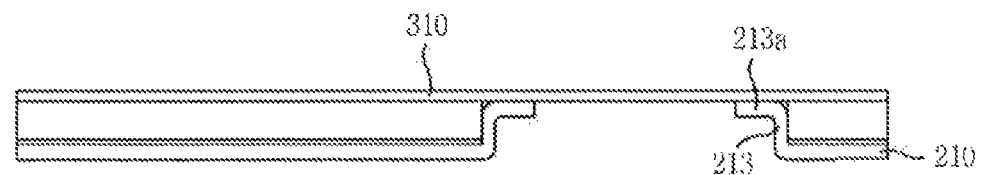

FIG. 7A is an exploded perspective view of an EMI gasket according to a third embodiment of the present invention, and FIGS. 7B and 7C are cross-sectional views illustrating modified examples thereof.

An EMI gasket 300 according to the embodiment includes an thermally conductive support 310. In detail, while the thermally conductive support 310 adheres to a top surface of the cover 210, the cover 210 surrounds the core 120 and the support 310 interposing an adhesive 220 therebetween.

The blocking parts 213 of the cover 210 adhere to only the sidewalls of the through hole 121 and do not protrude from the top surface of the core 120 but may protrude from and be bent at the top surface of the core 120 to adhere to the top surface of the core 120.

The support 310 does not include a through hole to close the through hole 121 of the core 120 and may have a thickness, for example, at or below half the thickness of the core 120.

Metal foil such as copper foil or a thermally conductive member such as a thermally conductive pad may be applied to the support 310. As a result, it is necessary for the support 310 to have high thermal conductivity. Also, a graphite sheet, which performs horizontal heat transfer well, may be embedded in the support 310.

When the support 310 is formed of copper foil and the EMI gasket is applied as shown in FIG. 3B, the thermal interface materials 2 formed of an elastic electroconductive silicone rubber and the like come into contact with the support 310 such that heat of a heating element 1 of the circuit board is transferred to the case 22.

The support 310 provides a physical force while the core 120 is surrounded by the cover 210 such that the EMI gasket 300 may have a precise and uniform size and may be easily manufactured.

Referring to FIG. 7B, the blocking parts 213 of the cover 210 do not adhere to the sidewalls of the through hole 121 of the core 120 and adhere to the support 310. In other hand, the blocking parts 213 of the cover 210 are inclined and ends of the blocking parts 213 directly adhere to the support 310 so as not to adhere to the sidewalls of the through hole 121 of the core 120.

Adhesive parts 213a horizontally formed at the ends of the blocking parts 213 elongate so as to stably and reliably adhere to the support 310.

Since the blocking parts 213 of the cover 210 do not come into contact with and not adhere to the sidewalls of the through hole 121 of the core 120 but adhere to the support 310 in the through hole 121, as a result, the sidewalls of the through hole 121 are blocked so as to block electromagnetic waves which flow in and discharge in the longitudinal direction of the core 120.

Referring to FIG. 7C, the blocking parts 213 of the cover 210 adhere to the sidewalls of the through hole 121 of the core 120 and adhere to the support 310 due to the adhesive parts 213a horizontally formed at the ends of the blocking parts 213 so as to increase reliability of adhesion.

Fourth Embodiment

Figure 8A:
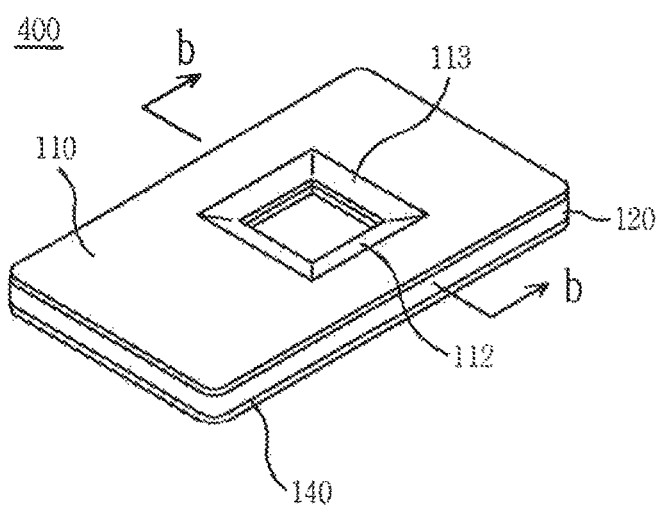
FIG. 8A is an exploded perspective view of an EMI gasket according to a fourth embodiment of the present invention.
Figure 8B:
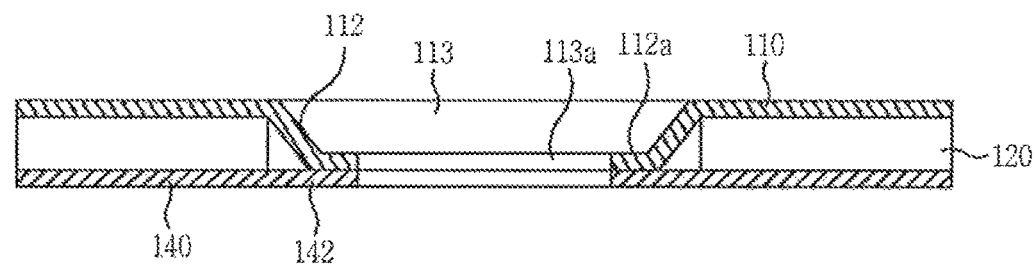
FIG. 8B is a cross-sectional view taken along a line b-b of FIG. 8A.

FIG. 8A is an exploded perspective view of an EMI gasket according to a fourth embodiment of the present invention, and FIG. 8B is a cross-sectional view taken along a line b-b of FIG. 8A.

An EMI gasket 400 includes the core 120 including the through hole 121 formed therein and includes electroconductive covers 110 and 140 which adhere to the top surface and the bottom surface of the core 120, respectively.

According to the embodiment, ends of blocking parts 112, 113, and 142 of the covers 110 and 140 adhere to one another in the through hole 121 to cover the sidewalls of the through hole 121 while the blocking parts 112, 113, and 142 do not adhere to the sidewalls of the through hole 121.

The covers 110 and 140 are electroconductive adhesive tapes including an adhesive on at least one surface thereof, and any one thereof may be a double-sided adhesive tape. Both the covers 110 and 140 may be single-sided adhesive tapes. In this case, each of the covers 110 and 140 may include an adhesive, which adheres to any one exposed surface thereof, to adhere to a facing object.

According to the above structure, the ends of the blocking parts 112 and 113 of the cover 110 and the ends of the blocking parts 142 of the cover 140 adhere to one another in the through hole 121 so as to cover the sidewalls of the through hole 121 and block electromagnetic waves which flow in and discharge in the lateral direction and the longitudinal direction of the core 120.

The electroconductive covers 110 and 140 adhere to the top surface and the bottom surface of the core and the ends of the blocking parts 112, 113, and 142 of the covers 110 and 140 adhere to one another in the through hole 121 of the core 120 such that the blocking parts 112 and 113 of the cover 110 and the blocking parts 142 of the cover 140 do not adhere to the sidewalls of the through hole 121 of the core 120 and block the sidewalls inside the through hole 121 to block electromagnetic waves, which flow in and discharge through the sidewalls, whose concept is equal to that of the above embodiment.

To allow the ends of the blocking parts 112, 113, and 142 of the covers 110 and 140 to adhere to one another in the through hole 121 of the core 120, the blocking parts 112 and 113 of the cover 110 are formed to elongate and incline and the blocking parts 142 of the cover 140 are formed to be short such that the covers 110 and 140 may have the same sized openings.

Referring to FIG. 8B, adhesive parts 112a and 113a, which are flush with each other at the ends, by bending the blocking parts 112 and 113 of the cover 110 twice at a preset angle so as to easily adhere to the blocking parts 142 of the cover 140.

To this end, the size of the opening formed by the covers 110 and 140 may be smaller than a size of the through hole 121.

The embodiment may be adequate when the core 120 has a wide width of 8 mm or more and a thin thickness of 1.5 mm or less. Since the blocking parts 112 and 113 are bent and pushed to adhere to the blocking parts 142 of the cover 140 without adhering to the sidewalls of the through hole 121 of the core 120, manufacturing is easy and mass production is possible.

In the embodiment, since the ends of the blocking parts 112, 113, and 142 of the covers 110 and 140 adhere to one another interposing adhesives therebetween in the through hole 121 of the core 120, strong adhesives are used or overlapping parts for adhesion are increased not to be detached.

According to the structure, since sidewalls of a through hole formed in a core are covered by an electroconductive cover such that an inflow and an outflow of electromagnetic waves through the sidewalls are shielded, an electronic component, which is located in the through hole or at a part connected through the through hole and is sensitive to electromagnetic waves, may be protected or shielded from electromagnetic waves.

Also, when an adhesive tape having self adhesion adheres to at least one surface of an electroconductive cover exposed to the outside or one surface of the core, it is easy to mount the gasket on a facing object.

Also, the sidewalls of the through hole formed in the core which face each other may be covered by blocking parts of an upper cover or covered by blocking parts of the upper cover and a lower cover so as to efficiently and reliably block electromagnetic waves.

Also, the blocking parts of the cover which cover the sidewalls of the through hole may be located above and below the core and may electrically connect objects facing each other through the blocking parts.

Also, an electroconductive covers are continuously formed on a top surface and a bottom surface of the core or a cover is formed on a part of a side surface of the core such that an effect of shielding electromagnetic waves between facing objects is high.

Also, since the core does not easily stretch due to a polymer film adhering thereto while being manufactured as a roll, manufacturing is easy and the cover easily adheres to the sidewalls of the through hole.

Also, when the EMI gasket has a thin thickness in comparison to a width and a length, an inflow or an outflow of electromagnetic waves through the through hole may be reliably shielded.

Also, thermal interface materials may be mounted on a support located in the through hole and may connect a heating element of a circuit board to a metal case for cooling so as to transfer heat of the heating element to the case.

Also, since a roll-shaped core including a through hole and an electroconductive cover including an incised part continuously adhere while passing through a mold, sidewalls of the through hole are covered by the electroconductive cover, and then the core and the cover are cut into a desired length or shape, workability is high and automation is possible so as to reduce manufacturing costs.

Although the embodiments of the present invention have been described above, a variety of modifications may be made by those skilled in the art. Accordingly, the scope of the present invention will not be interpreted while being limited to the above embodiments but will be interpreted according to the following claims.

What is claimed is:

1. An electromagnetic interference (EMI) gasket for shielding electromagnetic waves or grounding electricity, comprising:
    an elastic core which comprises a first surface and a second surface opposite to each other in a thickness direction and a through hole passing through the first and second surfaces; and
    an electroconductive cover which adheres to the first surface with an adhesive interposed therebetween, wherein parts of the cover which face the through hole are incised to integrally form a plurality of blocking parts, and wherein the blocking parts cover and adhere to sidewalls of the through hole and the blocking parts are bent and extend above the second surface and adhere to the second surface.

2. The EMI gasket of claim 1, wherein a polymer film adheres to any one of the first and second surfaces of the core due to an additional adhesive therebetween or self-adhesion of the core, and wherein the polymer film comprises an opening formed corresponding to the through hole.

3. The EMI gasket of claim 1, wherein an electroconductive adhesive member adheres to the second surface of the core except the through hole.

4. The EMI gasket of claim 1, wherein the adhesive is one of an adhesive tape having self adhesion, a hot melt having adhesion through heat, and an adhesive which is a liquid and becomes a solid through curing.

5. The EMI gasket of claim 1, wherein both lateral ends of the cover do not cover a side surface of the core.

6. The EMI gasket of claim 1, wherein both lateral ends of the cover cover side surfaces of the core, are bent and extend above the second surface, and adhere to the second surface.

7. An EMI gasket for shielding electromagnetic waves or grounding electricity, comprising:
    an elastic core which comprises a first surface and a second surface opposite to each other in a thickness direction and a through hole passing through the first and second surfaces; an electroconductive first cover which adheres to the first surface with an adhesive interposed therebetween; and
    an electroconductive second cover which comprises an opening facing the through hole and adheres to the second surface with an adhesive interposed therebetween, wherein parts of the first cover at a position facing the through hole are incised to integrally form a pair of blocking parts which face each other in a longitudinal direction of the core, wherein parts of the second cover at a position facing the through hole are incised to integrally form a pair of blocking parts which face each other in a lateral direction of the core, and wherein the blocking parts of the first and second covers cover and adhere to sidewalls of the through hole in the longitudinal direction and the lateral direction.

8. An EMI gasket for shielding electromagnetic waves or grounding electricity, comprising: an elastic core which comprises a first surface and a second surface opposite to each other in a thickness direction and a through hole passing through the first and second surfaces; a thermally conductive support which adheres to the second surface; and an electroconductive cover which adheres to the first surface, wherein parts of the cover which face the through hole are incised to integrally form blocking parts, and wherein the blocking parts cover sidewalls of the through hole and the blocking parts adhere to the thermally conductive support.

9. The EMI gasket of claim 8, wherein the thermally conductive support is a copper foil or a graphite sheet.

10. The EMI gasket of claim 8, wherein a thermally conductive member is applied to the thermally conductive support.

11. An EMI gasket for shielding electromagnetic waves or grounding electricity, comprising: an elastic core which comprises a first surface and a second surface opposite to each other in a thickness direction and a through hole passing through the first and second surfaces; an electroconductive first cover which adheres to the first surface; and an electroconductive second cover which adheres to the second surface,
wherein the first and second covers comprise blocking parts formed at a position corresponding to the through hole, and wherein the blocking parts of the first and second covers adhere to each other in the through hole and cover sidewalls of the through hole of the core.

12. The EMI gasket of claim 11, wherein the first and second covers are electroconductive adhesive tapes, and at least any one thereof is an electroconductive double-sided adhesive tape.

13. The EMI gasket of claim 11, wherein the blocking parts of the first and second covers do not adhere to the sidewalls of the through hole of the core.

14. The EMI gasket of claim 11, wherein a size of an opening formed by the first and second covers in the through hole is smaller than a size of the through hole.

* * * * *